United States Patent
Roberts et al.

(10) Patent No.: US 6,515,859 B2
(45) Date of Patent: Feb. 4, 2003

(54) HEAT SINK ALIGNMENT

(75) Inventors: John H. Roberts, Hickory, MS (US); Ronald David Goss, Meridian, MS (US); Jack C. Sondermeyer, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 0 days.

(21) Appl. No.: 09/877,137

(22) Filed: Jun. 11, 2001

(65) Prior Publication Data

US 2002/0006028 A1 Jan. 17, 2002

Related U.S. Application Data

(60) Provisional application No. 60/217,381, filed on Jul. 11, 2000.

(51) Int. Cl.$^7$ .................................................. H05K 7/20
(52) U.S. Cl. .................... 361/695; 361/692; 361/704; 165/80.2; 165/104.33; 257/717
(58) Field of Search ................ 361/687, 694, 361/695, 697, 704, 707, 689–690, 714, 717, 718, 719; 257/717–727, 712–714; 165/80.2, 80.3, 104.33, 104.34, 185; 174/16.3; 454/184

(56) References Cited

U.S. PATENT DOCUMENTS

| | | | | |
|---|---|---|---|---|
| 3,741,292 A | * | 6/1973 | Kumar et al. ............... | 165/105 |
| 3,942,586 A | * | 3/1976 | Fries ........................... | 165/105 |
| 4,103,737 A | * | 8/1978 | Perkins ......................... | 165/80 |
| 4,699,208 A | * | 10/1987 | Wolf et al. .................... | 165/47 |
| 4,847,449 A | | 7/1989 | Jordan et al. ........... | 174/138 G |
| 5,002,123 A | * | 3/1991 | Nelson et al. .............. | 165/147 |
| 5,077,601 A | * | 12/1991 | Hatada et al. ................ | 357/81 |
| 5,235,491 A | * | 8/1993 | Weiss ......................... | 361/694 |
| 5,563,768 A | * | 10/1996 | Perdue ....................... | 361/695 |
| 6,219,241 B1 | | 4/2001 | Jones ......................... | 361/704 |
| 6,219,248 B1 | | 4/2001 | Werner et al. .............. | 361/719 |

FOREIGN PATENT DOCUMENTS

| | | | | |
|---|---|---|---|---|
| GB | 2296132 A | * | 6/1996 | ............ H05K/7/20 |
| JP | 403291418 A | * | 12/1991 | ............ F24C/7/02 |
| JP | 407221229 A | * | 8/1995 | ............ H01L/23/36 |
| JP | 2001257494 A | * | 3/2000 | ............ H05K/7/20 |

* cited by examiner

Primary Examiner—Darren Schuberg
Assistant Examiner—Michael Datskovsky
(74) Attorney, Agent, or Firm—Dykema Gossett, PLLC

(57) ABSTRACT

A heat sink alignment apparatus having an internal chamber with a plurality of heat sinks placed at an angled relationship to one another creating a tunnel through which air streams flows. At least one heat source is attached to a heat sink. A plurality of air streams enter the heat sink alignment apparatus through an ambient air intake and over a fan into the tunnel. The tunnel gradually narrows thereby increasing the velocity of the air streams which increases the cooling of the heat source. The narrowing shape of the tunnel creates turbulence within the plurality of air streams increasing the transfer of heat to various airstreams from the heat sink thereby lowering the temperature of the heat sources also.

9 Claims, 2 Drawing Sheets

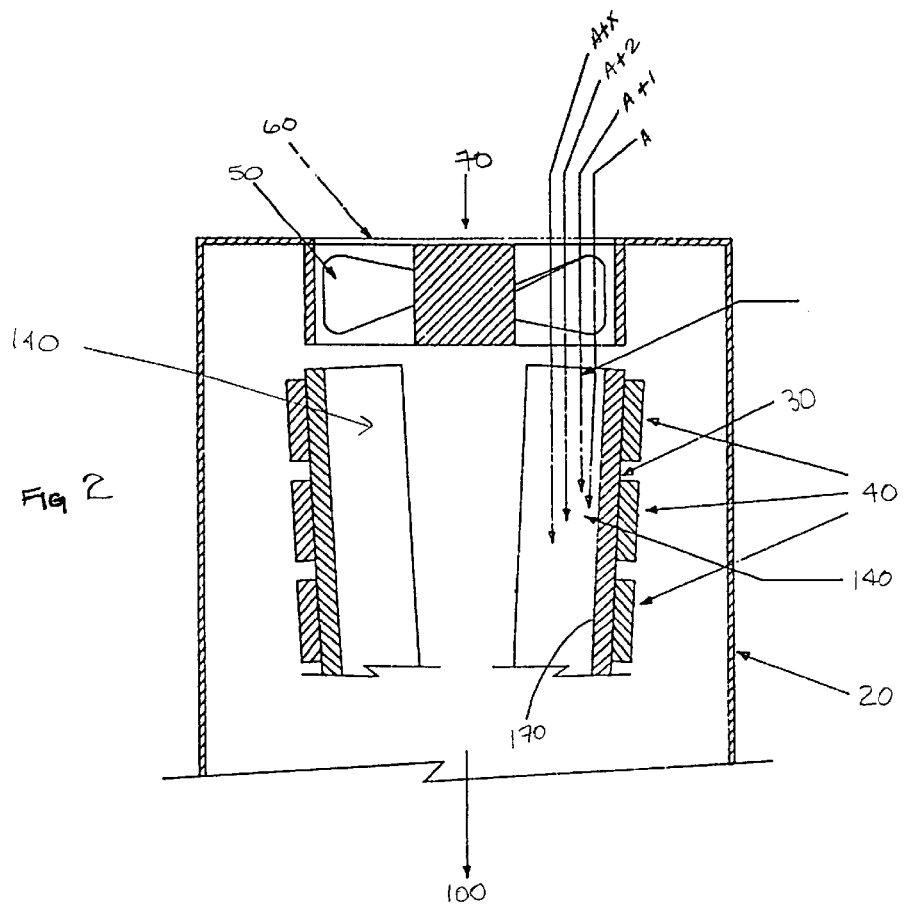
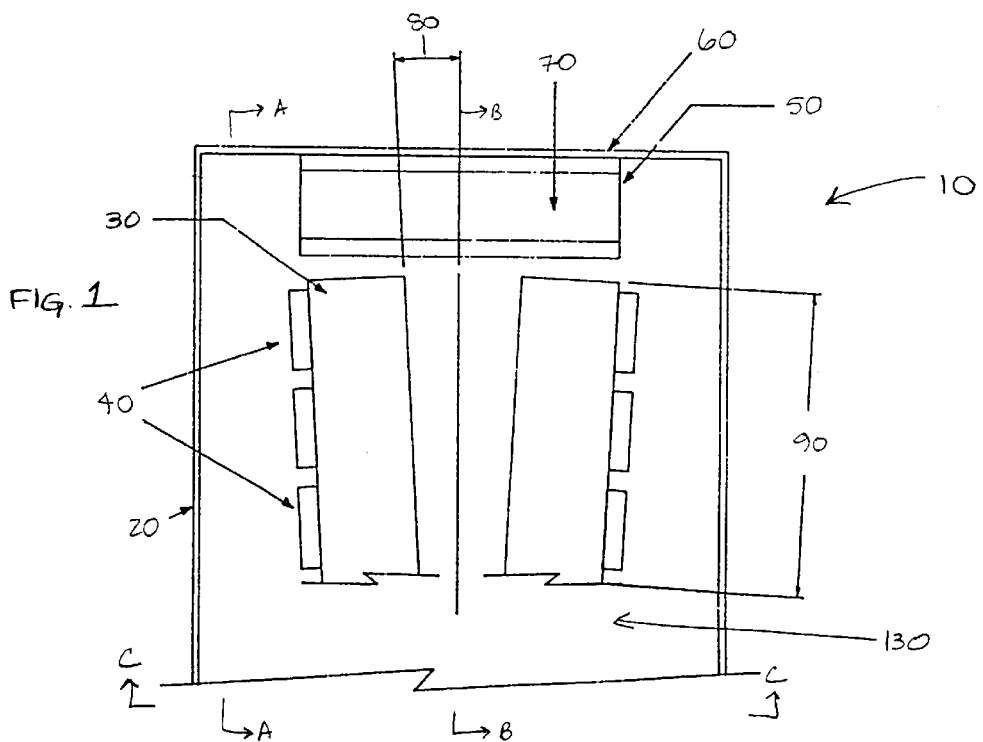

HEAT SINK ALIGNMENT

CROSS-REFERENCE TO RELATED APPLICATION

This application claims priority to a provisional application no. 60/217,381, filed Jul. 11, 2000.

BACKGROUND OF THE INVENTION

This invention relates to a heat sink alignment and more particularly to a heat sink alignment apparatus having a graduated path that increases the temperature of the heat sink.

The heat that builds in electrical circuits and related devices can cause failure of electrical components in such circuits. Therefore, by controlling the heat that develops in such situations allows the devices and circuits to perform at optimum levels without risk of failure.

A common method of controlling heat build-up is with the use of heat sinks wherein the excess heat is absorbed by the heat sink and eventually dissipated into the surrounding atmosphere.

The challenge of controlling heat transfer is increased because electronic devices usually have limited space available for such heat sinks. Therefore, there is a need in the electronic industry for a heat controlling device that is compact yet effective at reducing heat from within small confined electronic devices.

The present invention solves the common problem of getting adequate cooling from the already heated air at the exit end of the heat tunnel.

SUMMARY OF THE INVENTION

It is an object of the present invention to provide a device that will reduce the temperature of an electronic device quickly and in a small space.

To accomplish the task of reducing heat quickly and efficiently, the present invention uses an internal air chamber with a plurality of heat sinks placed at an angled relationship to one another creating a tunnel through which the hot air flows. A plurality of airstreams enter the heat sink alignment apparatus through an ambient air intake and over a fan into a tunnel. The tunnel gradually narrows thereby increasing the velocity of the air which increases the cooling of the heat source. The narrowing shape of the tunnel creates turbulence within the plurality of airstreams equalizes the temperatures of the various airstreams.

BRIEF DESCRIPTION OF THE DRAWINGS

FIG. 1 is a top plan view of the present invention;

FIG. 2 is a cross-sectional top view of the heat sink alignment of the present invention;

DETAILED DESCRIPTION OF THE INVENTION

Figure 3:
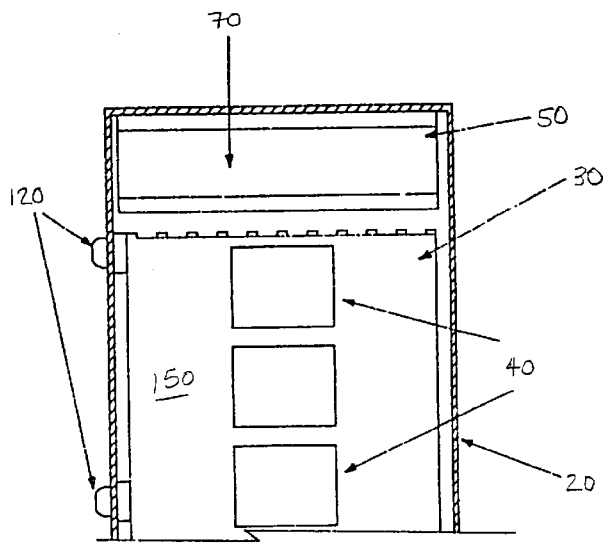
FIG. 3 is a cross-sectional view of the present invention taken along line A—A in FIG. 1.

The heat sink alignment apparatus 10 as shown in FIGS. 1 and 2 has a housing 20 that encloses at least two heat sinks 30 with a plurality of heat sources 40 located adjacent thereto. The housing or enclosure 20 is hollow forming an air chamber 130. The enclosure 20 can be as wide, deep and long as is desired or which is necessary to accommodate the electrical component that it is cooling. Although the present embodiment discloses a rectangular shaped enclosure, it is possible for it to come in any variety of shape and size, whatever is necessary to keep its associated electrical component cool.

In the present embodiment, the enclosure 20 is rectangular in shape with two opposite ends open. A fan 50 is attached to and within the enclosure 20 at one end of the heat sink alignment apparatus 10. The fan 50 is used to facilitate the movement of air through the apparatus 10 past the various heat sources 40.

Air enters the heat sink alignment apparatus 10 through an ambient air intake 60 in the direction of arrow 70. The fan 50 draws air into the heat sink alignment apparatus 10 and pushes it into and through a tunnel 140 formed in the middle area of the apparatus 10. The tunnel 140 is formed of the two opposing heat sinks 30 that funnel the air from the ambient air intake 60, along the length 90 of the heat sources 40 and out the opposite end of the heat sink alignment apparatus 10 in the direction of output airflow 100.

The heat sinks 30 are set at an angle 80 in order to form a funnel atmosphere wherein the end of the tunnel 140 adjacent the fan 50 is wider than the opposite end of the tunnel 140. Such structure is critical to aiding the dissipation of heat from the heat source 40.

As shown in FIG. 3, a plurality of heat sources 40 are arranged adjacent each heat sink 30, usually in a linear fashion, but other arrangements are foreseeable. This arrangement of the heat sources 40, adjacent the heat sink 30, allows for the air flowing through the tunnel 140 (Shown in FIGS. 1 & 2) to cover a large portion of the surface area of the heat source 40 thereby increasing the cooling effect.

A plurality of heat sources 40 are attached to the outer surface 160 of a base plate portion 150 of each heat sink 30. The outer surface 160 of the base plate portion 150 is the side of the heat sink 30 that is opposite the tunnel 140. A portion of the heat within the heat sources 40 is transferred to heat sink 30.

Figure 4:
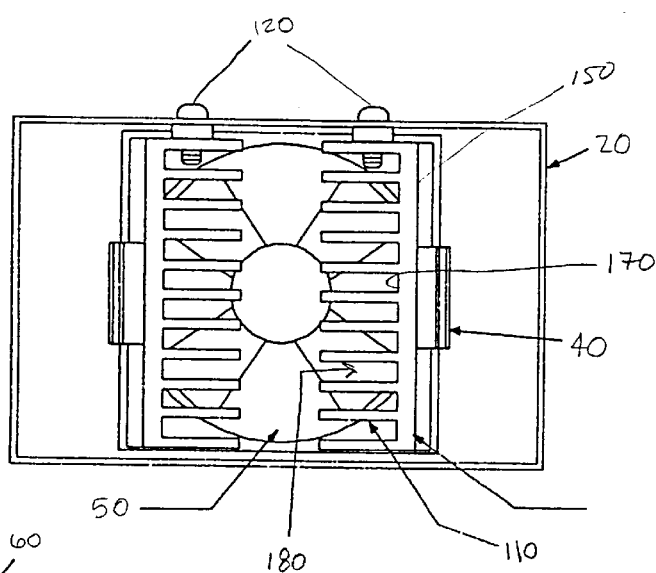
FIG. 4 is a cross-sectional view of the present invention taken along line B—B in FIG. 1.
Figure 5:
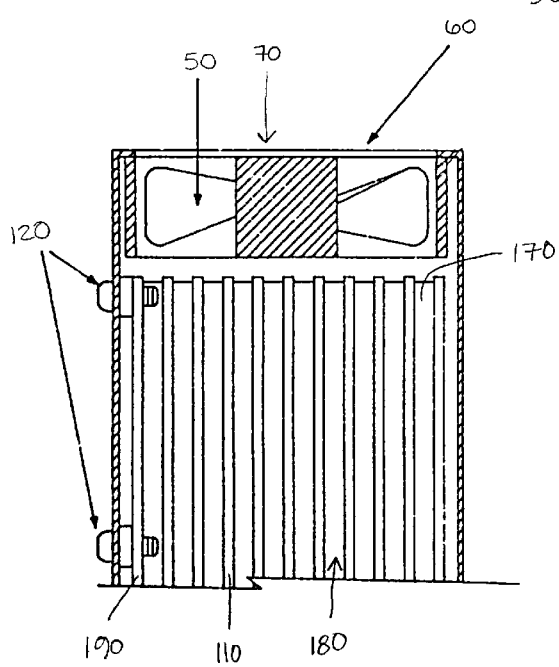
FIG. 5 is a cross-sectional view of the present invention taken along line C—C in FIG. 1.

Extending from the inner surface 170 of, and perpendicular to, the base plate portion 150 of each heat sink 30 are a plurality of heat sink fins 110, as shown in FIGS. 4 and 5. The plurality of fins 110 define a series of channels 180. The surface area of each channel 180 increases the total surface area of the heat sink 30 thereby creating a much larger area for dissipating heat away from the numerous heat sources 40.

Each heat sink 30 also has at least one mounting device 120 attached to the enclosure 20 and the end fin 190 thereby securing each heat sink 30 to the enclosure 20.

When in use, the air enters the enclosure 20 through the ambient air intake 60, over the fan 50 and into the tunnel area 140. As shown in FIG. 2, the air streams A, A+1, A+2, A+X, increase across the ambient air intake 60, from one side to the other. As each air stream A, A+1, A+2, A+X, enters the tunnel 140, it flows for the first portion of the tunnel 140 in a somewhat parallel manner to the inner surface 170 of the heat sink 30 within the channels 180 and increasing its temperature due to the adjacent heat source 40.

Each air stream A, A+1, A+2, A+X, eventually intersects with the inner surface 170 and is deflected at a slight angle into the other air streams causing them to deviate from the original path. For example, air stream A enters the tunnel 140 and strikes the inner surface 170 of the heat sink 30 causing it to be redirected creating a turbulent mixture with air stream A+1, then the mixture of both air streams A and A+1 travel along the inner surface 170 to a point further from the fan 50 wherein the combination or mixture eventually intersects with the inner surface 170 causing the mixture to be deflected into air stream A+2, and so on.

As each air stream A, A+1, A+2, A+X is deflected, redirected and mixed with adjacent air streams, its temperature is reduced. Therefore, as the air streams A, A+1, A+2, A+X travel along the heat sink, their temperature is increased as they pass over the various heat sources 40, yet when they are turbulently mixed together with one another, they dissipate heat and lower their temperature, thus reducing the heat from the electrical device associated therewith as the air streams travel down the tunnel 140 from one end to the other end until being expelled at the narrower end of the tunnel 140.

The heat dissipating action is achieved by the process of Airstream A being constantly mixed with airstreams from the center of the tunnel 140. As the mixing occurs, the temperature of Airstream A is reduced from what it would be if no mixing were to occur. Due to the mixing, the central airstreams will have their temperature raised from the heat picked up by airstream A from the end of the tunnel 140, through hot air output, the total temperature of the air will be raised due to heat transferred from the heatsink 30 to air in contact with the heatsink 30. The air in airstream A is constantly being interchanged with air from adjacent airstreams A+1, A+X, and is not a fixed entity. This type of exchange is also applicable to the adjacent airstreams, A+1, A+2, A+X.

The cross-section of the tunnel 140 decreased from one end to the other end. This reduction in cross-sectional area causes an increase in velocity of the air streams A, A+1, A+2, A+X, and as such, increases the cooling of the adjacent heat sources 40.

Although a particular embodiment of the invention has been described in detail herein with reference to the accompanying drawings, it is to be understood that the invention is not limited to this precise embodiment, and that various changes and modifications may be effected therein by one skilled in the art without departing from the scope or spirit of the invention as defined in the appended claims, such as the angles of the various heat sinks 30 can be different. It is also foreseeable that the angles and lengths of the heat sinks 30 can also vary and do not need to be symmetrical.

What is claimed is:

1. A heat sink alignment apparatus for use in cooling an associated electrical device, said apparatus comprising:
    an enclosure with an internal chamber, said internal chamber having a central axis;
    a plurality of heat sinks within said internal chamber, each of said heat sinks is positioned at an angle from said central axis forming a tunnel;
    at least one mounting device for attaching said plurality of heat sinks to said enclosure; an ambient air intake formed in one end of said enclosure;
    a fan adjacent said ambient air intake;
    said tunnel having a first end and a second end; and
    at least one heat source connected to said heat sink.

2. The heat sink alignment apparatus as claimed in claim 1, wherein:
    each of said plurality of heat sinks has a base plate and a plurality of fins;
    said fins are attached to said base plate forming a plurality of channels providing a large surface area for dissipating heat from said at least one heat source.

3. The heat sink alignment apparatus as claimed in claim 2, wherein:
    said angles of each said heat sink are the same as one another.

4. The heat sink alignment apparatus as claimed in claim 2, wherein:
    said angles of each of said heat sinks are not the same as one another.

5. A heat sink alignment apparatus comprising:
    an enclosure having a first end and a second end;
    an ambient air intake formed in said first end of said enclosure for introducing air into said enclosure;
    said enclosure having a central axis;
    a fan adjacent said ambient air intake at said first end;
    a plurality of heat sinks positioned within said enclosure and attached thereto with at least one mounting device;
    said heat sinks angled from said central axis forming a tunnel from said first end of said enclosure to said second end of said enclosure;
    an opening located at said second end for expelling air from within said enclosure; and
    at least one heat source attached to at least one of said heat sinks adjacent said tunnel, said heat source transferring heat from itself to said heat sink thereby raising the temperature of said at least one heat sink.

6. The heat sink alignment apparatus as claimed in claim 5, wherein:
    the end of said tunnel at said first end of said enclosure is wider than then end of said tunnel at said second end of said enclosure thereby increasing the velocity of air that passes through said tunnel, wherein said increased velocity cools said heat sinks and adjacent heat sources.

7. The heat sink alignment apparatus as claimed in claim 6, wherein:
    each of said plurality of heat sinks has a base plate and a plurality of fins;
    said fins are attached to said base plate forming a plurality of channels providing a large surface are for dissipating heat from said at least one heat source.

8. The heat sink alignment apparatus as claimed in claim 7, wherein:
    said angles of each said heat sink are the same as one another.

9. The heat sink alignment apparatus as claimed in claim 7, wherein:
    said angles of each of said heat sinks are not the same as one another.

* * * * *